United States Patent [19]

Cotreau

[11] Patent Number: 4,879,520
[45] Date of Patent: Nov. 7, 1989

[54] HIGH ACCURACY CURRENT SOURCE AND HIGH ACCURACY TRANSCONDUCTANCE STAGE

[75] Inventor: Gerald M. Cotreau, Melbourne, Fla.

[73] Assignee: Harris Corporation, Melbourne, Fla.

[21] Appl. No.: 263,189

[22] Filed: Oct. 27, 1988

[51] Int. Cl.[4] .............................................. H03F 3/45
[52] U.S. Cl. ................................... 330/257; 330/288; 307/296.1
[58] Field of Search .................... 330/257, 288, 297; 323/315, 316; 307/297, 315, 296.1

[56] References Cited

U.S. PATENT DOCUMENTS

| | | | |
|---|---|---|---|
| 3,281,535 | 10/1966 | Reiffin | 330/297 X |
| 3,815,037 | 6/1974 | Wheatley, Jr. | 330/257 X |
| 4,801,892 | 1/1989 | Yamakoshi et al. | 330/288 |

FOREIGN PATENT DOCUMENTS

| | | | |
|---|---|---|---|
| 25307 | 2/1986 | Japan | 330/257 |
| 277212 | 12/1986 | Japan | 330/288 |

Primary Examiner—James B. Mullins
Attorney, Agent, or Firm—Barnes & Thornburg

[57] ABSTRACT

A current source including a correction circuit configured as a secondary current source for adding current to the output as a function of base current of a primary transistor current source and increase impedance level of the output terminal by adding incremental current to the output terminal equal to the incremental current of the primary transistor current source to cancel the effect of the primary transistor current source on output impedance. The improved current source also improves the performance of a current mirror or pulley and a differential to single-ended current converter.

34 Claims, 2 Drawing Sheets

HIGH ACCURACY CURRENT SOURCE AND HIGH ACCURACY TRANSCONDUCTANCE STAGE

BACKGROUND AND SUMMARY OF THE INVENTION

The present invention relates generally to current sources and more specifically to high impedance, high accuracy current sources and their application to current mirrors and differential to single-ended current converters.

Ideal current sources have output impedance of infinity and provide a specific current level. In actuality, these characteristics can only be approximated. In all implementations of current sources, they deviate from the ideal in at least two ways. The first is a parasitic parallel resistance which lowers the current source impedance from its ideal value of infinity. A second deviation is in the current level itself from the desired value because of current errors and biasing errors. This is particularly bothersome in bipolar current sources. Since the collector impedance of a bipolar transistor is inversely proportional to the current level, it is difficult to design a high impedance current source for high current levels with bipolar transistors. Also, it is difficult to set a precise current level since base current errors accumulate in bipolar transistors and drift as the bipolar transistor parameters drift with temperature changes.

A typical bipolar current source or current stack is illustrated in FIG. 1 including transistors Q1 and Q2 having their emitter-to-collector current paths connected between nodes N3 and N4. Their bases are connected to nodes N1 and N2. Nodes N1, N2 and N4 are DC bias levels with the output current I-out being at node 3 and being represented by equation (1).

$$I_{out} = I_{CQ2} = I_{EQ1} - I_{BQ1} - I_{BQ2} \quad (1)$$

The desired value for an ideal current source is $I_{EQ1}$. The base currents for transistors Q1 and Q2, namely $I_{BQ1}$ and $I_{BQ2}$, represent error terms.

The output impedance is dominated by the collector-base impedance of Q2, which is given by equation (2), $$R = 1/h_{obQ2} \quad (2)$$

as the inverse of the small signal grounded base output admittance $h_{obQ2}$. $h_{ob}$ is a linear function of collector current level, so as the magnitude of the current source increases, its impedance decreases and deviates further from the ideal.

The prior art generally includes a sensor which provides a feedback to the input to cancel input bias and noise currents. A typical example in a differential bipolar amplifier is U.S. Pat. No. 4,639,684 to Laude. In operational amplifiers, the output impedance of a voltage gain stage has been increased by feeding back current from the output current stage as shown in U.S. Pat. No. 4,560,948 to Prentice and Cotreau.

Thus, it is an object of the present invention to reduce the current error produced by the base currents of the transistors Q1 and Q2 as well as minimizing the reduction of output impedance due to the collector impedance of the output transistor, and to make these improvements independent of the magnitude of the current source.

Another object of the present invention is to provide a high impedance, high accuracy current mirror.

A still further object of the present invention is to provide a high impedance, high accuracy differential to single-ended current converter or transconductance stage.

These and other objects of the invention are attained by providing a correction circuit connected to the bases of the first and second transistors for adding current to the output terminal as a function of the base current of the first and second transistors, and adding incremental current to the output terminal equal to those drawn by the second transistor to increase the output impedance to effectively cancel and replace the smaller output impedance of the second transistor with the higher impedance of a transistor in the correction circuit biased at lower current. This results in the first and second transistor forming a first current source having a first output current and first output impedance and a parallel second current source for providing a second output current smaller than the first output current and a second output impedance higher than the first output impedance at the output terminals. The correction circuit or second current source includes a third transistor having its emitter-collector current path connected in series between the bases of the first and second series connected transistors of the first current source and a fourth transistor having its emitter and collector connected between the base of the second or output transistor and the output terminal. The bases of the third and fourth transistor are connected to reference terminals. The third and fourth transistors have alpha's of approximately one.

This high impedance, high accuracy current source can be used as the output leg of a current mirror. The input leg would include appropriately connected transistors to bias the first and third transistors such that the sum of their collector currents is equal to the input current of the current mirror. Thus, the input leg would have a fifth transistor having its emitter-collector current path in the input leg and a sixth transistor having its emitter-collector path connected between the base of the fifth transistor and the emitter-collector path of the fifth transistor. The base of the third transistor is connected to the base of the sixth transistor and the emitter-collector path of the fifth transistor.

A high impedance, high accuracy differential current to single-ended current converter can also be produced using the high impedance, high accuracy current source and a modified high impedance, high accuracy current source. Each input would include a variable current source structured as the previously discussed high impedance, high accuracy current source with the current inputs being connected to the emitter-collector path of the first and second transistors. The output terminals are connected so as to subtract the currents of the two variable current sources. Preferably a high impedance, high accuracy current mirror connects the first current source to the second current source. As an alternative, the correction circuit of the second current source instead of adding current and impedance to the output of the second current source, subtracts the base current compensation from the output of the first current source and increases the output impedance to infinity with substituting a higher output impedance. This is done on the output leg of the current mirror.

Other objects, advantages and novel features of the present invention will become apparent from the following detailed description of the invention when considered in conjunction with the accompanying drawings.

DETAILED DESCRIPTION OF THE DRAWINGS

Figure 2:
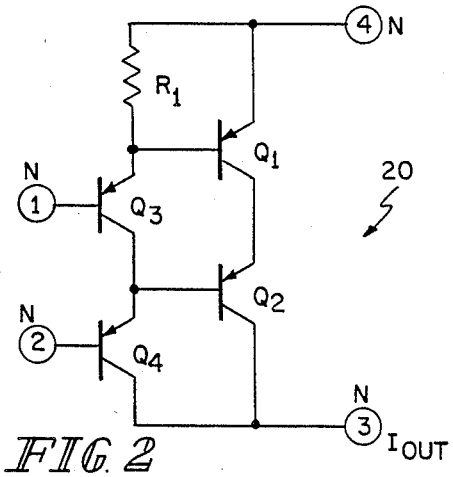
FIG. 2 is a schematic of a high impedance, high accuracy current source according to the principles of the present invention.

FIG. 2 shows a high impedance, high accuracy current source 20 including a first current source including transistors Q1 and Q2 having their emitter-collector current path connected in series between a reference node N4 and an output node N3. A correction circuit connected between the bases of Q1 and Q2 and the output node N3 includes transistors Q3 and Q4. The transistors Q3 and Q4 form a second current source in parallel with the first, and the parallel combination has smaller error currents and higher impedance than the first current source alone. The emitter-collector path of Q3 is connected between the bases of transistors Q1 and Q2 and has its base connected to a reference node N1. The transistor Q4 has its emitter-collector path connected between the base of transistor Q2 and the output node N3 and has its base connected to a reference node N2. DC biasing levels are connected to nodes N1, N2 and N4 as in FIG. 2. Base current errors of first current source transistors Q1 and Q2 flow through second current source transistors Q3 and Q4 and are added to the output terminal N3.

The second current source formed by transistors Q3 and Q4 operates at a lower current than the primary current source Q1 and Q2, and the base error currents of Q3 and Q4 can be set to be small and independent of the primary current source Q1 and Q2. Since the second current source operates at lower current, it has a higher output impedance than Q2. The second current source formed by transistors Q3 and Q4 also provides a higher output impedance to the output terminal by cancelling the impedance contribution of the first current source formed by transistors Q1 and Q2. The correction circuit formed by transistors Q3 and Q4 also add current to the output terminal at node N3 as a function of the base current of the transistors Q1 and Q2 and add impedance to the output terminal of node N3 while canceling the lower output impedance of Q2.

The resistor R1 connects the reference node N4 to the emitter-collector path of transistors Q3 and Q4 to supply a very small DC bias current. This is not necessary and may be deleted.

To analyze the correction of the base current according to the circuit of FIG. 2, reference should be made to the following equations wherein A is the alpha of the transistor and ICQ2 is defined by equation (1).

$$ICQ3 = IBQ1 * A3 \quad (3)$$

$$ICQ4 = (ICQ3 + IBQ2)*A4 = IBQ1*A3*A4 + IBQ2*A4 \quad (4)$$

$$\begin{aligned} I_{out} &= ICQ2 + ICQ4 \\ &= IEQ1 - IBQ1*(1 - A3*A4) = IBQ2*(1 - A4) \end{aligned} \quad (5)$$

The alpha's of transistors 3 and 4 are selected to be approximately equal to one and are generally in the range of 0.99 to 0.999. This will cause the terms represented by the base current error of transistors Q1 and Q2 to be reduced by one or two orders of magnitude, as illustrated in equation (5) compared to the prior art of equation (1).

To analyze the impedance of the circuit in FIG. 2, both transistors Q2 and Q4 have a collector-base impedance due to transistor hob. As the collector of Q2 moves by a voltage V, a current of V*hobQ2 flows towards the base. Since the collector impedance of Q3 is very high compared to the emitter impedance of Q4, the current V*hobQ2 flows into the emitter of Q4 and on to the collector where it is summed with the original current to which it is opposite and almost equal. The net current due to Q2 is:

$$I = V*hobQ2*(1-A4) \quad (6)$$

A current due to hobQ4 also flows from the node N3 to the base of Q4 which is AC grounded. Total current flow due to a voltage excursion V at node N3 is:

$$I = V*(hobQ4 + hobQ2(1 - A4)) \quad (7)$$

and the effective impedance is:

$$R = 1/(hobQ4 + hobQ2(1 - A4)) \quad (8)$$

Figure 1:
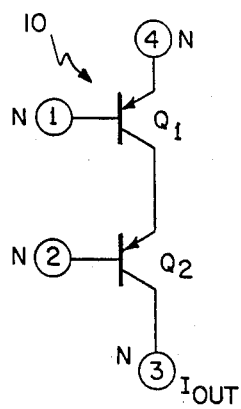
FIG. 1 is a schematic of a current source of the prior art.

With A4 selected to be substantially equal to one, the contribution of the admittance of Q2 is substantially reduced by orders of magnitude. Since the signal base output admittance is approximately equal to $I_c/BV_A$, where B is transistor grounded emitter current gain and $V_A$ is transistor early voltage, both constant for similar transistors, hob is proportional to $I_c$. Thus, the admittance of Q4 is one if not two orders of magnitude smaller than the contribution of the admittance of Q2. Thus, the total admittance of the circuit of FIG. 1 versus the circuit of FIG. 2 are many orders of magnitude smaller when one compares equations (2) and (8). Since the admittance is the inverse of the output resistance, the output resistance of FIG. 2 and equation (8) are orders of magnitude larger than that of FIG. 1 and equation (2).

Figure 3:
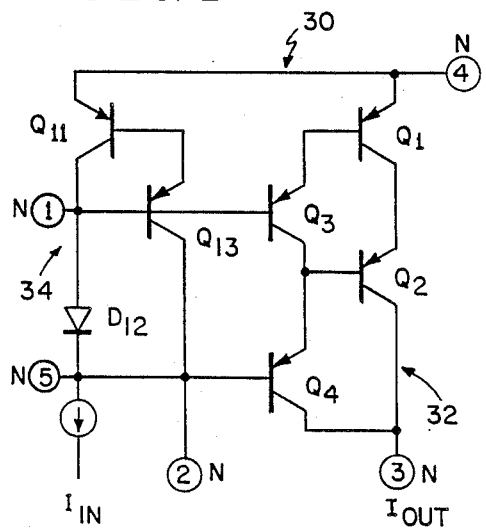
FIG. 3 is a schematic of a high impedance, high accuracy current mirror according to the principles of the present invention.

Ideally, current mirrors require an exact image of the current between the input and output with an infinite output impedance and no errors. Another function of the current mirror can be referred to as a current pulley wherein the input current is reversed on the output so as to convert a current source at the input terminal to a current sink at the output terminal and vice versa. The high impedance, high accuracy current source 20 of FIG. 2 is provided in a high impedance, high accuracy current mirror 30 of FIG. 3.

The current mirror 30 includes an input leg 34 receiving an input current I-in and an output leg 32 connected thereto providing an output current I-out. The output leg 32 includes a high impedance, high accuracy current source of FIG. 2 including transistors Q1, Q2, Q3 and Q4. Reference to the description of the operation of correction of this high impedance, high accuracy current source should be made. The input leg 34 of the current mirror 30 includes a transistor Q11 having its emitter-collector path connected between reference node N4 and the input node N5 and a transistor Q13 having its emitter-collector path connected between the base of transistor Q11 and the input node N5. The base of transistor Q13 is connected to the base of transistor Q3 at node N1 which is also connected to the emitter-collector path of Q11. A diode D12 connects node N1 to node N5. The base Q4 of the output current leg 32 at node N2 is also connected to node N5. The node N2 may be connected to any reference source and need not be connected at N5. The diode D12 is only one convenient way to provide a reference voltage for node N2.

The transistors Q11 and Q13 are connected and operate as Q1 and Q3 respectively, such that the sum of the currents in the collectors of Q11 and Q13 is equal to the sum of the currents in the collectors of Q1 and Q3.

In operation, the input I-in of current mirror 30 pulls node N5 and node N1 down until Q11 and Q13 are turned on and I-in =ICQ11 +ICQ13. At this point, the voltage at node N1 is exactly the value necessary to sustain the current of ICQ11 +ICQ13 =I-in. This voltage at node N1 is also applied to the base of Q3. Device Q3 matches Q13, Q1 matches Q11, so that the voltage node at N1 is exactly that necessary to provide ICQ3 +ICQ1 =I-in. The accurate mirroring of the input current I-in to the output current I-out is evident from the following equations (9)-(12):

$$I_{in} = ICQ11 + ICQ13 = ICQ1 + ICQ3 \quad (9)$$

$$ICQ2 = ICQ1 - IBQ2 \quad (10)$$

$$ICQ4 = (ICQ3 + IBQ2)A4 \quad (11)$$

$$I_{out} = ICQ2 + ICQ4 = ICQ1 + ICQ3*A4 - IBQ2(1 - A4) \quad (12)$$

As in the previous embodiments, A4 is substantially equal to 1 and therefore, the error due to the base current IBQ2 is substantially reduced by orders of magnitude and the equation (12) for I-out becomes substantially the same as the current I-in of equation (9). The analysis of the output impedance because of the relationship between Q2 and Q4 of equations (8) still apply to the output node N3 of the current mirror 30. By ratioing emitter areas of Q3 and Q13, and Q1 and Q11, the accurate mirrored current can be an accurate multiple of the input current.

Figure 4:
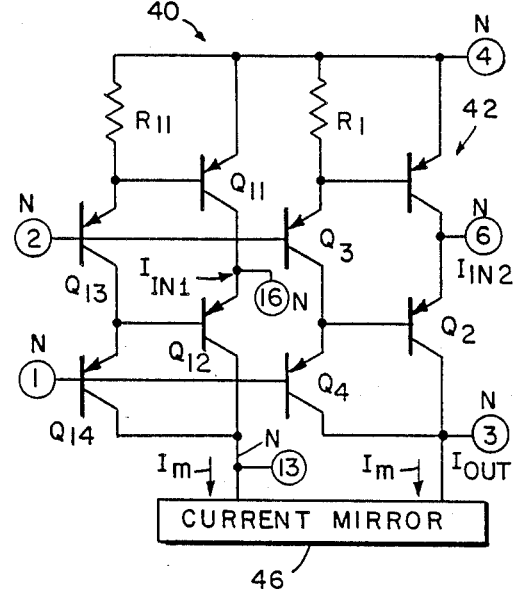
FIG. 4 is a schematic of a high impedance, high accuracy differential to single-ended current converter according to the principles of the present invention.

A differential to single-ended current converter 40 is illustrated in FIG. 4. Such converters provide variable gain in operational amplifiers and ideally produce zero output current for zero input differential current and infinite output impedance. Less than infinite output impedance lowers the voltage gain and power supply rejection rating. Non-zero output current when differential input current is zero affects, for example, the input offset voltage. Thus, the current converter 40 incorporates the high impedance, high accuracy current sources 20 of FIG. 2, since it provides improved output impedance and reduces current errors.

The current converter 40 includes a first variable current source 44 having an input node N16 to receive input current I-in1 and a second variable current source 42 having an input node N6 to receive a second input current I-in2. The output of the first variable current source 44 at node N13 is subtracted from the output of the second variable current source 42 at node N3. This difference is the output current I-out at node N3. A current mirror or pulley 46 interconnects node N13 and node N3 to subtract the output current of the first current source 44 from the second current source 42 at node N3. The current mirror 46 would be the high impedance, high accuracy current mirror 30 of FIG. 3. Since each of the current elements include high impedance and high accuracy, the total differential to single-ended current converter 40 produces a high impedance, high accuracy output.

Figure 5:
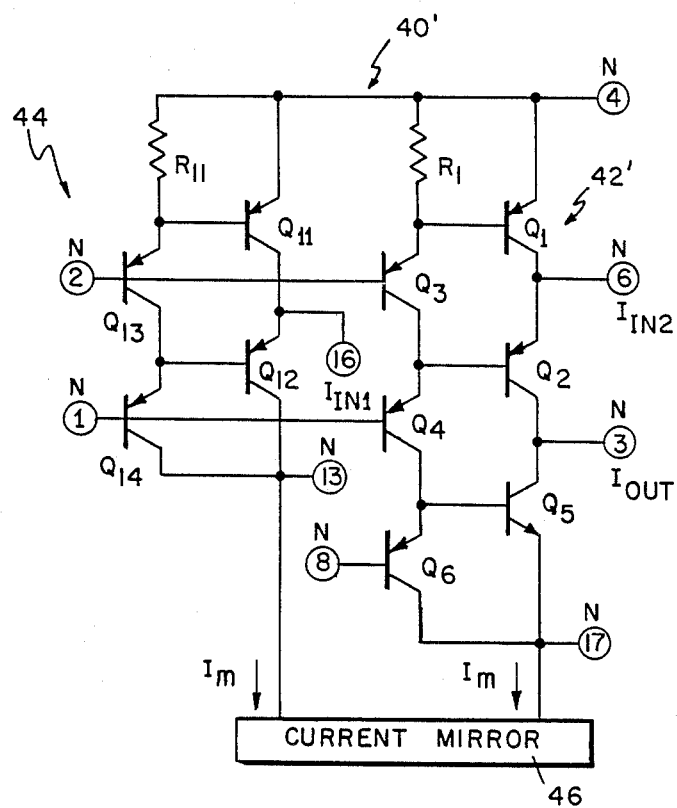
FIG. 5 is a schematic of another embodiment of a differential to single-ended current converter or high accuracy transconductance stage according to the principles of the present invention.

A modification to the differential to single-ended current converter 40 of FIG. 4 is shown as current converter 40' in FIG. 5. Instead of adding current and impedance to the output node N3 for the second high accuracy current source 42', these corrections are subtracted from the current and impedance of the first high impedance, high accuracy current source 44 without substituting a higher impedance of Q4 of the correction circuit. This is done at the output of the current mirror 46. This modifications results in even higher or substantially infinite output impedance than that of the high accuracy current source.

In this modification, a transistor Q5 having its collector-emitter path connected between the output node N3 and the output node N17 of the current mirror 46. A transistor Q6 has its emitter-collector path connected between the base of Q5 and node N17. The emitter-collector path of Q4 is disconnected from between the base of Q2 and the output terminal node N3 and is connected between the base of Q2 and the base of Q5. Thus, the base currents of Q1 and Q2 flow through Q6 to node N17. Transistor Q2 along with Q5 forms the high impedance output node at N3 and Q6 provides a conduit for the error currents to the output node. The base currents of Q1, Q2 and Q5 are cancelled by flowing through Q6 to the output node N17 of the current mirror where they are subtracted from the current mirror output current resulting from error currents through parasitic impedance.

This method also cancels the reduction of output impedance of Q1, Q2 and Q5, but does not include substituting the impedance of Q4 or Q6. Instead, the error currents are sensed at the base of Q1, Q2 and Q5 and are fed back as cancelling current to the output. Thus, the output impedance is substantially infinite.

The collector current of Q5 is reduced by exactly the same error current by which Q2 collector current is reduced. For no input, the two variable current sources 42 and 42' provide exactly matched currents through Q2 and Q5 producing no output current.

Using equations (1), (3) and the following equations, (13)-(15), the output current I-out is defined in equation (16) as follows:

$$ICQ4 = IBQ1*A3*A4 + IBQ2*A4 \quad (13)$$

$$\begin{aligned}ICQ6 &= ICQ4*A6 - IBQ5*A6 \\ &= IBQ1*A3*A4*A6 + IBQ2*A4*A6 - IBQ5*A6\end{aligned} \quad (14)$$

$$\begin{aligned}ICQ5 &= IM*A5 - ICQ6*A5 \\ &= IM*A5 - IBQ1*A3*A4*A5*A6 - \\ &\quad IBQ2*A4*A5*A6 + IBQ5*A5*A6\end{aligned} \quad (15)$$

-continued $$I_{out} = ICQ2 - ICQ5 \tag{16}$$
$$= IEQ1 - IM - IBQ1*(1 - A3*A4*A5*A6) -$$
$$IBQ2*(1 - A4*A5*A6) + IBQ5(1 - A5*A6)$$

With no input current on nodes N6 and N16 and using the matching high accuracy current sources 44 and 42', and the emitter currents of transistors Q1 and Q11 are equal and are also equal to the current mirror current IM so IEQ1=IEQ11=IM, and thus, the error current for zero differential input current is defined as follows:

$$I_{outER} = IBQ1*(1 - A3*A4*A5*A6) + \tag{17}$$
$$IBQ2*(1 - A4*A5*A6) - IBQ5(1 - A5*A6)$$

Since the alpha's are very close to one, each error term is orders of magnitude smaller than what it would have been if uncorrected. In a standard implementation, the base currents appear whole and the output error current is $$I_{outER} = IBQ1 + IBQ2 - IBQ5 \tag{18}$$

orders of magnitude larger. Further, the situation is even better than this since the error current of equation (17) is matched by a similar error due to the high impedance, high accuracy current source of Q11, Q12, Q13 and Q14 which drive the current mirror 46. The output error current is actually the difference between the small error current of equation (17) and the matching error current of the Q11, Q12, Q13, Q14 current source. This is not presented here since it does not assist in understanding the invention.

The current converter of FIG. 5 also increases output impedance by routing error currents from parasitic impedances through the same path above to cancel themselves. If output node N3 moves by a voltage V, a current flows through hobQ2 and hobQ5. The current through Q2 flows into Q4's emitter, on into Q6's emitter, and on into Q5's emitter, and into node N3 where it is opposite and equal to the original current, cancelling itself.

Likewise, the current through hobQ5 flows into Q6's emitter, into Q5's emitter, to node N3 where it is also equal and opposite to the original hobQ5 current, also cancelling itself.

These cancellations of error currents are produced without substituting a parallel high output impedance device as in the other embodiments.

Due to Q2:

$$ICQ2 = V*\text{hob}Q2 = I1 \tag{19}$$
$$IBQ2 = ICQ2 \text{ when considering only hob component} \tag{20}$$
$$ICQ4 = ICQ2*A4 = V*\text{hob}Q2*A4 \tag{21}$$
$$ICQ5 = ICQ6*A5 = V*\text{hob}Q2*A4*A5*A6 = I2 \tag{22}$$
$$ICQ6 = ICQ4*A6 = V*\text{hob}Q2*A4*A6 \tag{23}$$

Due to Q6:

$$ICQ5_{in} = IBQ5 = V*\text{hob}Q5 = I3 \tag{24}$$
$$ICQ6 = IBQ5*A6 = v*\text{hob}Q5*A6 \tag{25}$$

-continued
$$ICQ5_{out} = ICQ6*A5 = V*\text{hob}Q5*A5*A6 = I4 \tag{26}$$

Net current out of node N3:

$$I_{out} = I1 - I2 + I3 - I4 \tag{27}$$
$$= V*\text{hob}Q2 - V*\text{hob}Q2*A4*A5*A6 + V*\text{hob}Q5 -$$
$$V*\text{hob}Q5*A5*A6$$
$$= V*(\text{hob}Q2*(1 - A4*A5*A6) +$$
$$\text{hob}Q5*(1 - A5*A6))$$

Since the alpha's are very close to one, the net output current is orders of magnitude smaller than for a standard converter and, hence, the output impedance level is orders of magnitude higher.

Although the differential to single-ended current converter 40 of FIG. 5 has been described in a high accuracy, high impedance circuit, it can also be used as a high impedance circuit alone. The high accuracy results from using the principles of the circuit of FIG. 2 in the input and output current sources 44 and 42, and the high accuracy current mirror of FIG. 3. The high output impedance results from the interrelationship of transistors Q2, Q4, Q5 and Q6 in cancelling the current induced impedance errors without substituting a higher impedance source. The principles of the high output impedance circuit of transistors Q2, Q4, Q5 and Q6 can be used independent of the high accuracy produced by input current source 44 and current mirror 46. If high accuracy is not needed, any input current source and current mirror may be used and the substantially infinite output impedance would be maintained by Q2, Q4, Q5 and Q6.

Some implementations of the prior art, to improve impedance levels, have cancelled hob current with current from hob of a matching transistor. This works fairly well but does depend on transistor matching characteristics and is good for perhaps 10X or one order of magnitude improvement at most. This invention does not depend on a transistor match and offers considerably more improvement. For transistor beta as low as 100, 50X improvement is possible.

Although the present invention has been described and illustrated in detail, it is to be clearly understood that the same is by way of illustration and example only, and is not to. b taken by way of limitation. All the transistors except Q5 have been illustrated as PNP's, but the principle is also applicable to NPN transistors in which case Q5 would be a PNP. Also, the present invention could be used with field effect transistors. The spirit and scope of the present invention are to be limited only by the terms of the appended claims.

What is claimed:
1. A current source comprising:
   first, second, third and fourth transistors each having a base terminal and a series current path between an emitter and a collector terminal;
   said first and second transistors having their emitter and collector terminals connected in series between a first reference terminal and an output terminal;
   said third transistor having its base terminal connected to a second reference terminal and its emitter and collector terminals connected to said base terminals of said first and second transistors respectively;

said fourth transistor having its base terminal connected to a third reference terminal and its emitter and collector terminals connected to said second transistor's base terminal and said output terminal respectively to provide a low impedance current path therebetween.

2. A current source according to claim 1, wherein said third and fourth bipolar transistors have alpha's of approximately one.

3. A current source comprising:
a first and second transistor having their emitter-collector paths connected in series between a first reference terminal and an output terminal; and
correction means connected to bases of said first and second transistors and said output terminal for adding current to said output terminal as a function of base current of said first and second transistors, and for sensing incremented current through said second transistor and adding said sensed incremented current to said output terminal to cancel the effect of said second transistor on the impedance of said output terminal.

4. A current source according to claim 3, wherein said correction means includes a third transistor having its emitter-collector path connected between said bases of said first and second transistors and a fourth transistor having its emitter-collector path connected between said second transistor's base and said output terminal.

5. A current source according to claim 4, wherein said third and fourth bipolar transistors have alpha's of approximately one.

6. A current source comprising:
a first current means connected to an output terminal for providing a first output current and a first output impedance at said output terminal;
a second current means connected to said output terminal for providing a second output current smaller than said first output current and a second output impedance larger than said first output impedance at said output terminal; and
means connecting said first and second current means for controlling said second output current as a function of said first output current and cancelling said first output impedance.

7. A current source according to claim 6, wherein said first current means includes first and second bipolar transistors having their emitter-collector paths connected in series between a first reference terminal and said output terminal.

8. A current source according to claim 7, wherein said connecting means connects said second current means between said output terminal and bases of said first and second transistors.

9. A current source according to claim 7, wherein said second current means and connecting means include a third transistor having its emitter-collector path connected between bases of said first and second transistors and a fourth transistor having its emitter-collector path connected between said second transistor's base and said output terminal.

10. A current source according to claim 9, wherein said third and fourth bipolar transistors have alpha's of approximately one.

11. In a current mirror including an input leg connected between a current input terminal and a first reference terminal and an output leg connected to said input leg and between a current output terminal and said first reference terminal providing an output current at said output terminal proportional to an input current at said input terminal, the improvement being said output leg which comprises:
first and second transistors having their emitter-collector paths connected in series between said first reference terminal and said output terminal and
correction means connected to bases of said first and second transistors, said output terminal and said input leg for adding current to said output terminal as a function of base current of said first and second transistors and adding incremental current to said output terminal to increase impedance of said output terminal.

12. A current mirror according to claim 11, wherein said correction means includes a third transistor having its emitter-collector path connected between said bases of said first and second transistors and its base connected to said input leg, and a fourth transistor having its emitter-collector path connected between said second transistor's base and said output terminal.

13. A current mirror according to claim 12, wherein said third and fourth bipolar transistors have alpha's of approximately one.

14. A current mirror according to claim 12, wherein said input leg includes:
a fifth transistor having its emitter-collector path connected between said first reference and said input terminals; and,
a sixth transistor having its emitter-collector path connected between a base of said fifth transistor and said input terminal and its base connected to said base of said third transistor and said input terminal.

15. In a current mirror including an input leg connected between a current input terminal and a first reference terminal and an output leg connected to said input leg and between a current output terminal and said first reference terminal providing an output current at said output terminal proportional to an input current at said input terminal, the improvement being said output leg which comprises:
a first current means connected to said output terminal and said input leg for providing a first output current and a first output impedance at said output terminal;
a second current means connected to said output terminal and said input leg for providing a second output current smaller than said first output current and a second output impedance larger than said first output impedance at said output terminal; and
means connecting said first and second current means for controlling said second output current as a function of said first output current and cancelling said first output impedance.

16. A current mirror according to claim 15, wherein said first current means includes first and second bipolar transistors having their emitter-collector paths connected in series between said first reference terminal and said output terminal.

17. A current mirror according to claim 16, wherein said connecting means connects said second current means between said output terminal and bases of said first and second transistors.

18. A current mirror according to claim 16, wherein said second current means and connecting means include a third transistor having its emitter-collector path connected between bases of said first and second transistors and its base connected to said input leg, and a fourth transistor having its emitter-collector path connected between said second transistor's base and said output terminal.

19. A current mirror according to claim 18, wherein said input leg includes:
   a fifth transistor having its emitter-collector path connected between said first reference and said input terminal; and,
   a sixth transistor having its emitter-collector path connected between a base of said fifth transistor and said input terminal and its base connected to said base of said third transistor and said input terminal.

20. A differential current to single-ended current converter including first and second variable current sources having first and second current input terminals and first and second output terminals, respectively, and subtracting means for subtracting output current at said first output terminal from the current at said second output terminal, said first and second variable current source each comprising:
   first and second transistors having their emitter-collector paths connected in series between a first reference terminal and its output terminal;
   correction means connected to bases of said first and second transistors and its output terminal for adding current to its output terminal as a function of base current of said first and second transistors and adding incremental current to said output terminal to increase impedance level of its output terminal as a function of current at its output terminal; and
   its current input terminal being connected to said series connected first and second transistors.

21. A current converter according to claim 20, wherein said correction means includes a third transistor having its emitter-collector path connected between said bases of said first and second transistors and a fourth transistor having its emitter-collector path connected between said second transistor's base and its output terminal.

22. A current converter according to claim 21, wherein said third and fourth bipolar transistors have alpha's of approximately one.

23. A current converter according to claim 20, wherein said subtracting means includes a current mirror having input and output legs connected to said first and second output terminals respectively, for providing a difference signal at said second terminal.

24. A differential current to single-ended current converter including first and second variable current sources having first and second current input terminals and first and second output terminals, respectively, and subtracting means for subtracting output current at said first output terminal from the current at said second output terminal, said first and second variable current source each comprising:
   a first current means connected to its output terminal for providing a first output current and a first output impedance at its output terminal;
   a second current means connected to its output terminal for providing a second output current smaller than said first output current and a second output impedance larger than said first output impedance at its output terminal;
   means connecting said first and second current means for controlling said second output current as a function of said first output current and cancelling said first output impedance; and
   its input terminal being connected to said first current means.

25. A current converter according to claim 24, wherein said first current means includes first and second bipolar transistors having their emitter-collector paths connected in series between a first reference terminal and its output terminal.

26. A current converter according to claim 25, wherein said connecting means connects said second current means between its output terminal and bases of said first and second transistors.

27. A current converter according to claim 25, wherein said connecting means senses incremented current through said second transistor and adds said sensed incremented current to said output terminal to cancel the effect of said second transistor on the impedance of said output terminal.

28. A current converter according to claim 24, wherein said subtracting means includes a current mirror having input and output legs connected to said first and second output terminals respectively for providing a difference signal at said second output terminal.

29. A differential current to single-ended current converter including first and second variable current sources having first and second current input terminals and first and second output terminals, respectively, and subtracting means for subtracting output current at said first output terminal from the current at said second output terminal, said first and second variable current source each comprising:
   first, second, third and fourth transistors each having a control terminal and a series current path between a first and second terminal;
   said first and second transistors having their first and second terminals connected in series between a first reference terminal and its output terminal;
   said third transistor having its control terminal connected to a second reference terminal and its first and second terminals connected between said control terminals of said first and second transistors;
   said fourth transistor having its control terminal connected to a third reference terminal and its first and second terminals connected between said second transistor's control terminal and its output terminal.

30. A current converter according to claim 29, wherein said transistors are bipolar transistors, and said control, first and second terminals are base, emitter and collector terminals, respectively for providing a difference signal at said second output terminal.

31. A current converter according to claim 29, wherein said subtracting means includes a current mirror having input and output legs connected to said first and second output terminals respectively for providing a difference signal at said first output terminal.

32. A current source comprising:
   a first and second transistor having their emitter-collector paths connected in series between a first reference terminal and an output terminal; and
   correction means connected to bases of said first and second transistors and said output terminal for sensing incremental current through said second transistor and for adding said sensed incremental current to said output terminal to increase impedance level of said output terminal.

33. A current source according to claim 32, wherein said correction means includes a third transistor having its emitter-collector path connected between said bases of said first and second transistors and a fourth transistor having its emitter-collector path connected between said second transistor's base and said output terminal.

34. A current source according to claim 33, wherein said correction means adds said sensed incremented current to said output terminal to cancel the effect of said second transistor on the impedance of said output terminal.

* * * * *